United States Patent
Wu

(10) Patent No.: US 7,816,168 B2
(45) Date of Patent: *Oct. 19, 2010

(54) METHOD FOR FORMING COLOR FILTER

(75) Inventor: Hsin-Ping Wu, Yilan County (TW)

(73) Assignee: United Microelectronics Corp., Science-Based Industrial Park, Hsinchu (TW)

( * ) Notice: Subject to any disclaimer, the term of this patent is extended or adjusted under 35 U.S.C. 154(b) by 104 days.

This patent is subject to a terminal disclaimer.

(21) Appl. No.: 12/138,690

(22) Filed: Jun. 13, 2008

(65) Prior Publication Data

US 2008/0248410 A1    Oct. 9, 2008

Related U.S. Application Data

(63) Continuation of application No. 11/458,695, filed on Jul. 20, 2006, now Pat. No. 7,410,822.

(51) Int. Cl.
*H01L 31/18* (2006.01)
(52) U.S. Cl. .................. 438/70; 438/702; 438/782; 257/E31.121
(58) Field of Classification Search ........... 257/E31.119
See application file for complete search history.

(56) References Cited

U.S. PATENT DOCUMENTS

| 5,534,720 | A | * | 7/1996 | Song et al. ............... 257/232 |
| 5,719,074 | A | * | 2/1998 | Hawkins et al. ............ 438/70 |
| 6,285,065 | B1 | * | 9/2001 | Levy ..................... 257/440 |
| 6,632,700 | B1 | * | 10/2003 | Fan et al. .................. 438/70 |
| 7,410,822 | B2 | * | 8/2008 | Wu ......................... 438/57 |
| 7,446,386 | B2 | * | 11/2008 | Eristoff et al. ............ 257/440 |

* cited by examiner

*Primary Examiner*—Stephen W Smoot
(74) *Attorney, Agent, or Firm*—Winston Hsu; Scott Margo; Min-Lee Teng

(57) ABSTRACT

A method for forming a color filter is provided. A substrate having a passivation layer thereon is provided. The passivation layer has at least one trench therein within a peripheral region of the substrate. A first color filter layer is formed over the passivation layer to fill the trench by performing a first spin-on coating process with a first spin rate. Thereafter, the first color filter layer is patterned so as to form a plurality of first color filter blocks in a display region of the substrate and expose a portion of the passivation layer. A second color filter layer is formed over the passivation layer by performing a second spin-on coating process with a second spin rate, which is larger than the first spin rate. Next, the second color filter layer is patterned to form a plurality of second color filter blocks between the first color filter blocks respectively.

19 Claims, 3 Drawing Sheets

METHOD FOR FORMING COLOR FILTER

CROSS-REFERENCE TO RELATED APPLICATION

This is a continuation application of patent application Ser. No. 11/458,695, filed on Jul. 20, 2006, which is now issued as U.S. Pat. No. 7,410,822.

BACKGROUND OF THE INVENTION

1. Field of Invention

The present invention relates to a method for forming a semiconductor device. More particularly, the present invention relates to a method for forming a color filter.

2. Description of Related Art

Recently, various displays comprising Liquid Crystal Display (LCD), Field Emission Display (FED), Organic Light Emitting Diode (OLED), and Plasma Display Panel (PDP) have come to be widely used in daily life, such as those applied in TVs, computers, projectors, mobile phones, and personal audio-visual fittings.

The difference among different types of displays lies in the imaging manner. One of them utilizes a light source, several optical elements composed of prism groups, and multiple panels corresponding to each beam. The principle thereof is that the light source (white light) is filtered into three primary color beams, R, G, B, with the prism groups, and then modulated with three panels to make the image signals carried in the three beams. Finally; the images can be synthesized by optical elements, such as, dichroic prisms and lenses. However, the three panels comprise a micro-display.

The micro-display can be applied in various kinds of displays, such as, LCD or OLED. However, besides the display region for forming the color filter thereon, the substrate further comprises the peripheral region having trenches serving as die seal ring or openings for exposing the metal pad underneath. Hence, during the different color filter layers are formed over the substrate to form the color filter array, the step high of the trench would lead to the striation effect of the color filter layers. The striation of the color filter layers extends from the trenches within the peripheral region of the substrate into the display region of the substrate. Therefore, the display performance is degraded.

SUMMARY OF THE INVENTION

Accordingly, the present invention is to provide a method for forming a color filter capable of preventing a display region from being damaged by the striation effect.

The present invention is also to provide a method for forming a color filter capable of increasing the performance of the display.

To achieve these and other advantages and in accordance with the purpose of the invention, as embodied and broadly described herein, the invention provides a method of forming a color filter over a substrate having a display region and a peripheral region surrounding the display region. The substrate has a passivation layer formed thereon and the passivation layer has at least one trench formed therein within the peripheral region. The method comprises a step of forming a first color filter layer over the passivation layer to fill the trench by performing a first spin-on coating process with a first spin rate. Thereafter, the first color filter layer is patterned so as to form a plurality of first color filter blocks in the display region and to expose a portion of the passivation layer. A second color filter layer is formed over the passivation layer by performing a second spin-on coating process with a second spin rate, which is larger than the first spin rate. Next, the second color filter layer is patterned to form a plurality of second color filter blocks between the first color filter blocks respectively.

According to an embodiment of the present invention, the method further comprises a step of forming a third color filter layer over the passivation layer by performing a third spin-on coating process with a third spin rate, which is larger than the second spin rate, and patterning the third color filter layer to form a plurality of third color filter blocks between the first color filter blocks and the second color filter blocks respectively.

According to an embodiment of the present invention, the method further comprises a step of selectively removing the first color filter layer in the trench after the third color filter blocks are formed.

According to an embodiment of the present invention, the trench is a die seal ring enclosing the display region.

According to an embodiment of the present invention, the trench is an opening exposing a metal pad formed under the passivation layer. The metal pad is electrically connected to a complementary metal-oxide semiconductor formed in the substrate.

The present invention also provides a method of forming a color filter over a substrate having a display region and a peripheral region surrounding the display region. The substrate has a passivation layer formed thereon and the passivation layer has at least one trench formed therein within the peripheral region. The method comprises a step of forming a first color filter layer of a first thickness over the passivation layer to fill the trench. Thereafter, the first color filter layer is patterned so as to form a plurality of first color filter blocks in the display region and to expose a portion of the passivation layer. A second color filter layer of a second thickness, which is smaller than the first thickness, is formed over the passivation layer. Next, the second color filter layer is patterned to form a plurality of second color filter blocks between the first color filter blocks respectively.

According to an embodiment of the present invention, the method for forming the first color filter layer includes a first spin-on coating process with a first spin rate, and the method for forming the second color filter layer includes a second spin-on coating process with a second spin rate, and the first spin rate is smaller than the second spin rate.

According to an embodiment of the present invention, the method further comprises a step of forming a third color filter layer of a third thickness, which is smaller than the second thickness, is formed over the passivation layer, and patterning the third color filter layer to form a plurality of third color filter blocks between the first color filter blocks and the second color filter blocks respectively.

According to an embodiment of the present invention, the method for forming the third color filter layer includes a third spin-on coating process with a third spin rate, and the second spin rate is smaller than the third spin rate.

According to an embodiment of the present invention, the method further comprises a step of selectively removing the first color filter layer in the trench after the third color filter blocks are formed.

According to an embodiment of the present invention, the trench is a die seal ring enclosing the display region.

According to an embodiment of the present invention, the trench is an opening exposing a metal pad formed under the passivation layer. The metal pad is electrically connected to a complementary metal-oxide semiconductor formed in the substrate.

The present invention further provided a method of forming a color filter over a substrate. The substrate has a passivation layer formed thereon and the passivation layer has at least one trench formed therein. The method comprises a step of filling the trench with a filler. A first spin-on coating process with a first spin rate is performed to form a first color filter layer of a first thickness over the passivation layer. Thereafter, the first color filter layer is patterned so as to form a plurality of first color filter blocks and to expose a portion of the passivation layer. Next, a second spin-on coating process with a second spin rate is performed to form a second color filter layer of a second thickness over the passivation layer. The first spin rate is smaller than the second spin rate and the first thickness is larger than the second thickness. The second color filter layer is patterned to form a plurality of second color filter blocks between the first color filter blocks respectively. Afterwards, the filler in the trench is removed.

According to an embodiment of the present invention, before the step of removing the filter and after the step of patterning the second color filter layer, the method further comprises a step of performing a third spin-on coating process with a third spin rate to form a third color filter layer of a third thickness over the passivation layer, wherein the second spin rate is smaller than the third spin rate and the second thickness is larger than the third thickness. Thereafter, the third color filter layer is patterned to form a plurality of third color filter blocks.

According to an embodiment of the present invention, the trench is a die seal ring enclosing a display region.

According to an embodiment of the present invention, the trench is an opening exposing a metal pad formed under the passivation layer.

According to an embodiment of the present invention, the metal pad is electrically connected to a complementary metal-oxide semiconductor formed in the substrate.

In the present invention, the first color filter layer (first color filter block) is formed to fill in the trench in the passivation layer prior to the formation of the second color filter layer (second color filter block) so that the striation, which is extending from the trench into the display region and caused by the step high of the trench, of the subsequent formed color filter layers can be effectively prevented. Furthermore, for the trench exposing the metal pad under the passivation layer, filling the first formed color filter into the trench can prevent the metal pad from being damaged by the developer during the formation of the other color filter blocks.

In order to make the aforementioned and other objects, features and advantages of the present invention comprehensible, a preferred embodiment accompanied with figures is described in detail below.

DESCRIPTION OF EMBODIMENTS

Figure 1A:
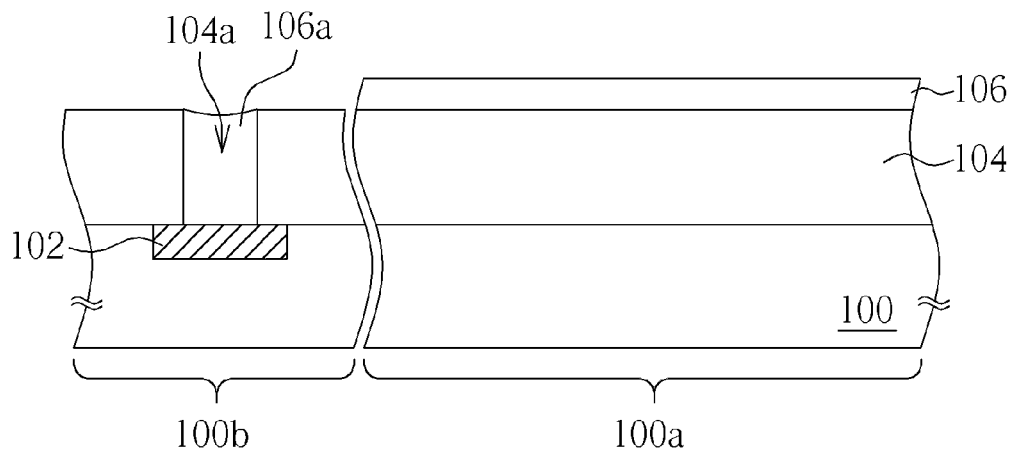
FIGS. 1A through 1D are cross-sectional views showing a method for forming a color filter according to an embodiment of the present invention.

FIGS. 1A through 1D are cross-sectional views showing a method for forming a color filter according to an embodiment of the present invention. As shown in FIG. 1A, a substrate 100 having a display region 100a and a peripheral region 100b is provided. The substrate 100 has a passivation layer 104 formed thereon. The passivation layer 104 has at least one trench 104a formed therein within the peripheral region 100b of the substrate 100. The trench 104a can be, for example, an opening exposing a metal pad 102 formed under the passivation layer 104. As shown in FIG. 2, the trench 104a can also be, for example, a die seal ring 104b enclosing the display region 100a. Furthermore, the metal pad 102 can be, for example, electrically connected to a complementary metal-oxide semiconductor (CMOS) formed in the substrate 100 for controlling the display formed in the display region 100a.

As shown in FIG. 1A, a first color filter layer 106 is formed over the substrate 100 and the material 106a of the first color filter layer 106 in the peripheral region 100b of the substrate 100 fills into the trench 104a. The method for forming the first color filter layer 106 includes a spin-on coating process with a first spin rate.

Figure 1B:
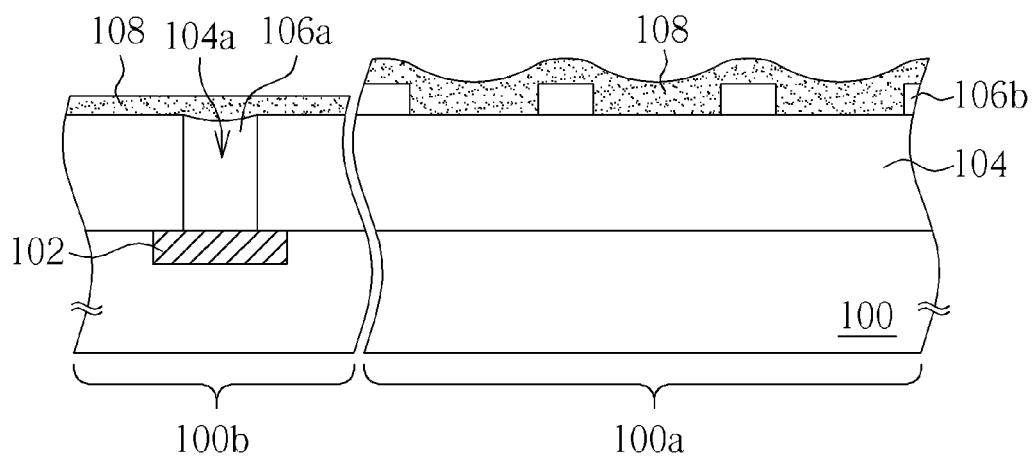
Figure 2:
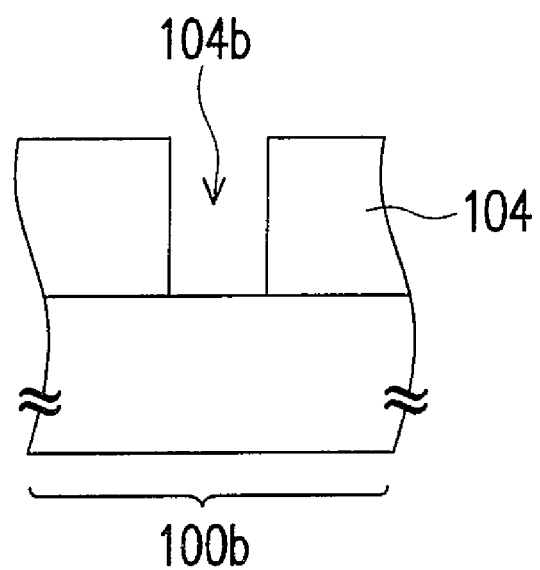
FIG. 2 is a cross-sectional view showing another exemplar of a trench in a peripheral region of a substrate shown in FIG. 1A.

As shown in FIG. 1B, the first color filter layer 106 is patterned into several first color filter blocks 106b in the display region 100a of the substrate 100 and the material 106a of the first color filter layer 106 still remains in the trench 104a within the peripheral region 100b of the substrate 100. The method for patterning the first color filter layer 106 comprises steps of exposing the first color filter layer 106 by a mask so as to transfer a color filter block pattern form the mask onto the first color filter layer 106 and then performing a developing process to remove the un-exposure portion of the first color filter layer 106 to form the first color filter blocks 106b.

Then, a second color filter layer 108 is formed over the substrate 100. The method for forming the second color filter layer 108 includes the spin-on coating process with a second spin rate. The second spin rate is larger than the first spin rate in order to evenly fill the second color filter layer 108 into the gaps between the first color filter blocks 106b. Furthermore, the thickness of the first color filter layer 106 is larger than the thickness of the second color filter layer 108 so that the second color filter layer 108 can be easily filled into the gaps between the first color filter blocks 106b.

Figure 1C:
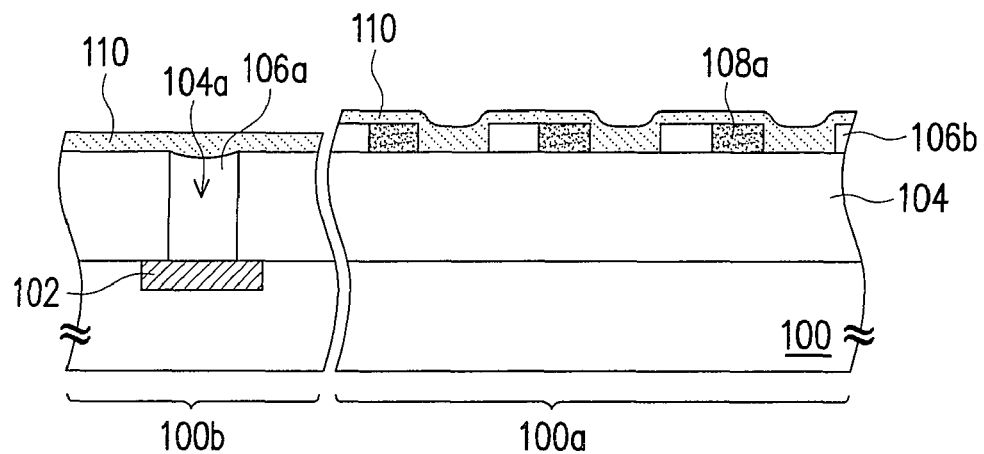

As shown in FIG. 1C, the second color filter layer 108 is patterned to form several second color filter blocks 108a between the first color filter blocks 106b respectively in the display region 100a of the substrate 100. The method for patterning the second color filter layer 108 is as same as the method for patterning the first color filter layer 106 mentioned above and is not detail described herein. Thereafter, a third color filter layer 110 is formed over the substrate 100. The method for forming the third color filter layer 110 includes the spin-on coating process with a third spin rate. The third spin rate is larger than the second spin rate in order to evenly fill the third color filter layer 110 in the spaces between the first color filter blocks 106b and the second color filter blocks 108a. Moreover, the thickness of the third color filter layer 110 is smaller than the thickness of the second color filter layer 108 so that the third color filter layer 110 can be easily filled into the spaces between the first color filter blocks 106b and the second color filter blocks 108a.

Figure 1D:
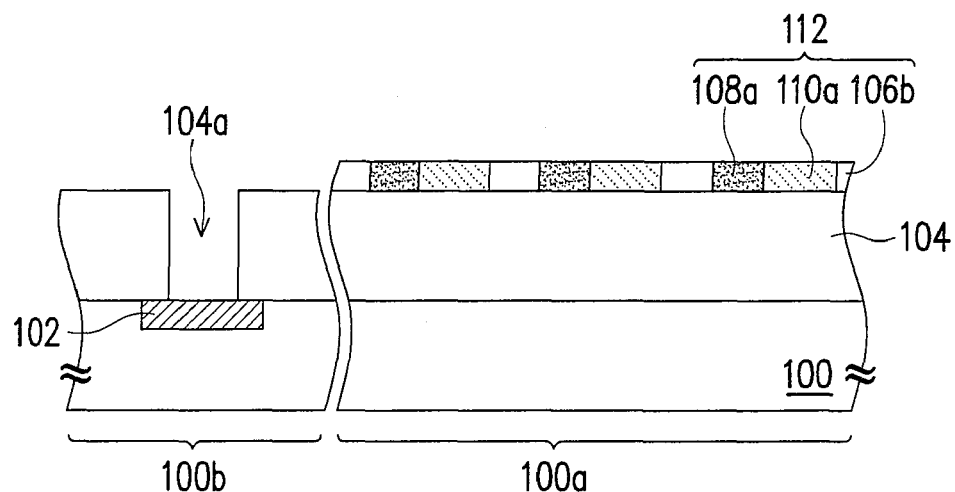

As shown in FIG. 1D, the third color filter layer 110 is patterned to form several third color filter blocks 110a between the first color filter blocks 106b and the second color filter blocks 108a respectively in the display region 100a of the substrate 100. The method for patterning the third color filter layer 110 is as same as the method for patterning the first color filter layer 106 mentioned above and is not detail described herein. Therefore, the first color filter blocks 106b, the second color filter blocks 108a and the third color filter blocks 110a together form a color filter 112. It should be noticed that the colors of the first color filter layer 106 (the first color filter blocks 106b), the second color filter layer 108 (the second color filter blocks 108a) and the third color filter layer 110 (the third color filter blocks 110a) are different from each other. After the third color filter blocks 110a are formed, the material 106a (shown in FIG. 1A) in the trench 104 is selectively removed according to the requirement of the circuit desigii. That is, the material 106a can be removed to expose the metal pad 102 underneath so that the metal pad 102 can be electrically connected to the external object, such as lead frame, through the later performed bonding process.

In this embodiment, the color filter 112 formed in the display region 100a of the substrate 100 is comprised of at least three different color filter blocks. However, in the practice, the color filter in the display region can be composed of at least two different color filter blocks. On the other words, as long as the color filter layer, with is first formed over the substrate, fills the trenches in the passivation layer in the peripheral region of the substrate, the later formed color filter can be free from the striation phenomenon caused by the step high of the trenches.

In the present invention, the first formed color filter layer fills into the trenches in the peripheral region of the substrate so that the striation effect caused by the step high of the trenches can be effectively improved. Furthermore, for the trench serving as an opening exposing the metal pad underneath, the first formed color filter layer filling into the trench can prevent the metal pad from being damaged by the developer during the step of patterning the color filter layers.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a color filter over a substrate having a display region and a peripheral region surrounding the display region, wherein the substrate has a passivation layer formed thereon and the passivation layer has at least one trench formed therein within the peripheral region, the method comprising:
   performing a first spin-on coating process with a first spin rate to form a first color filter layer over the passivation layer and to fill the trench;
   patterning the first color filter layer so as to form a plurality of first color filter blocks in the display region and to expose a portion of the passivation layer;
   performing a second spin-on coating process with a second spin rate to form a second color filter layer over the passivation layer, wherein the first spin rate is smaller than the second spin rate; and
   patterning the second color filter layer to form a plurality of second color filter blocks between the first color filter blocks respectively.

2. The method of claim 1, further comprising:
   performing a third spin-on coating process with a third spin rate to form a third color filter layer over the passivation layer, wherein the second spin rate is smaller than the third spin rate; and
   patterning the third color filter layer to form a plurality of third color filter blocks.

3. The method of claim 2, further comprising a step of selectively removing the first color filter layer in the trench after the third color filter blocks are formed.

4. The method of claim 1, wherein the trench is a die seal ring enclosing the display region.

5. The method of claim 1, wherein the trench is an opening exposing a metal pad formed under the passivation layer.

6. The method of claim 5, wherein the metal pad is electrically connected to a complementary metal-oxide semiconductor formed in the substrate.

7. A method of forming a color filter over a substrate having a display region and a peripheral region surrounding the display region, wherein the substrate has a passivation layer formed thereon and the passivation layer has at least one trench formed therein within the peripheral region, the method comprising:
   forming a first color filter layer of a first thickness over the passivation layer to fill the trench;
   patterning the first color filter layer so as to form a plurality of first color filter blocks in the display region and to expose a portion of the passivation layer;
   forming a second color filter layer of a second thickness over the passivation layer, wherein the first thickness is larger than the second thickness; and
   patterning the second color filter layer to form a plurality of second color filter blocks between the first color filter blocks respectively.

8. The method of claim 7, wherein the method for forming the first color filter layer includes a first spin-on coating process with a first spin rate, and the method for forming the second color filter layer includes a second spin-on coating process with a second spin rate, and the first spin rate is smaller than the second spin rate.

9. The method of claim 8, further comprising:
   forming a third color filter layer of a third thickness over the passivation layer, wherein the third thickness is smaller than the second thickness; and
   patterning the third color filter layer to form a plurality of third color filter blocks.

10. The method of claim 9, wherein the method for forming the third color filter layer includes a third spin-on coating process with a third spin rate, and the second spin rate is smaller than the third spin rate.

11. The method of claim 9 further comprising a step of selectively removing the first color filter layer in the trench after the third color filter blocks are formed.

12. The method of claim 7, wherein the trench is a die seal ring enclosing the display region.

13. The method of claim 7, wherein the trench is an opening exposing a metal pad formed under the passivation layer.

14. The method of claim 13, wherein the metal pad is electrically connected to a complementary metal-oxide semiconductor formed in the substrate.

15. A method of forming a color filter over a substrate, wherein the substrate has a passivation layer formed thereon and the passivation layer has at least one trench formed therein, the method comprising:
   filling the trench with a filler;
   performing a first spin-on coating process with a first spin rate to form a first color filter layer of a first thickness over the passivation layer;
   patterning the first color filter layer so as to form a plurality of first color filter blocks and to expose a portion of the passivation layer;
   performing a second spin-on coating process with a second spin rate to form a second color filter layer of a second thickness over the passivation layer, wherein the first spin rate is smaller than the second spin rate and the first thickness is larger than the second thickness;

patterning the second color filter layer to form a plurality of second color filter blocks between the first color filter blocks respectively; and removing the filler in the trench.

16. The method of claim 15, before the step of removing the filter and after the step of patterning the second color filter layer, further comprising:

performing a third spin-on coating process with a third spin rate to form a third color filter layer of a third thickness over the passivation layer, wherein the second spin rate is smaller than the third spin rate and the second thickness is larger than the third thickness; and patterning the third color filter layer to form a plurality of third color filter blocks.

17. The method of claim 15, wherein the trench is a die seal ring enclosing a display region.

18. The method of claim 15, wherein the trench is an opening exposing a metal pad formed under the passivation layer.

19. The method of claim 18, wherein the metal pad is electrically connected to a complementary metal-oxide semiconductor formed in the substrate.

* * * * *